United States Patent
Drori et al.

(10) Patent No.: US 6,331,768 B1
(45) Date of Patent: Dec. 18, 2001

(54) HIGH-RESOLUTION, HIGH-PRECISION SOLID-STATE POTENTIOMETER

(75) Inventors: Joseph Drori, San Jose; Allan Ming-Lun Lin, Fremont, both of CA (US)

(73) Assignee: Xicor, Inc., Milpitas, CA (US)

( * ) Notice: Subject to any disclaimer, the term of this patent is extended or adjusted under 35 U.S.C. 154(b) by 0 days.

(21) Appl. No.: 09/593,734

(22) Filed: Jun. 13, 2000

(51) Int. Cl.[7] ........................................ H03H 1/00

(52) U.S. Cl. .................... 323/369; 323/354; 323/297; 323/298

(58) Field of Search ........................ 323/353, 354, 323/369, 297, 298; 338/68, 118, 200

(56) References Cited

U.S. PATENT DOCUMENTS

| | | | |
|---|---|---|---|
| 2,999,228 | 9/1961 | Facciola | 340/173 |
| 3,069,598 | 12/1962 | Daily et al. | 317/101 |
| 3,581,252 | * 5/1971 | Sacher | 323/354 |

(List continued on next page.)

FOREIGN PATENT DOCUMENTS

| | | | |
|---|---|---|---|
| 2091918 | 8/1982 | (GB) | H03G/3/00 |
| 49-05562 | 1/1974 | (JP) . | |
| 49-130747 | 8/1974 | (JP) . | |
| 54-122341 | 8/1979 | (JP) | H01C/13/02 |
| 56-046505 | 4/1981 | (JP) | H01C/13/00 |
| 60-001909 | 1/1985 | (JP) | H03G/3/02 |
| 60-046411 | 3/1985 | (JP) | G01C/22/00 |
| 62-299116 | 12/1987 | (JP) | H03K/23/66 |
| WO 80/01632 | 8/1980 | (WO) | H03G/1/00 |

OTHER PUBLICATIONS

Huber, W.R., "Integrated Field–Effect Transistor Variolossers," *Proceedings of the 1968 Microelectronics Symposium.* Jun. 1968, pp.A3–1 through A3–7.

Sevastopoulos, N., et al., "An Unusual Circuit Configuration Improves CMOs–MDAC Performance," *Electronic Design News*, Mar. 5, 1979, pp. 77–81.

Koch, B., "Nonvolatile Static RAM 'Snapshots Data into $E^2PROM$," *Electronic Solid–State Circuits Conference (Digest of Technical Papers)*, Sep. 1982, pp. 69–75.

(List continued on next page.)

*Primary Examiner*—Peter S. Wong
*Assistant Examiner*—Gary L. Laxton
(74) *Attorney, Agent, or Firm*—Coudert Brothers (57) ABSTRACT

Disclosed are solid-state potentiometers having high resolution and high accuracy. An exemplary potentiometer has a first main terminal, a second main terminal, a wiper terminal, and a resistor stack having a plurality M of resistors coupled in series to one another at a plurality of M−1 internal nodes. Each of the resistors in the stack has substantially the same value of $R_S$ ohms. The potentiometer further has a first variable resistance network coupled between one end of the resistor stack and the potentiometer's first main terminal, and a second variable resistance network coupled between the other end of the resistor stack and the potentiometer's second main terminal. The first variable resistance network has a variable resistance value $R_1$ which varies between zero ohms and $R_P$ ohms. The second variable resistance network has a variable resistance value $R_2$ which is maintained substantially at value of $(R_P-R_1)$. The wiper terminal is selectively coupled to one of the internal nodes of the resistor stack, or to one of the ends of the resistor stack, to provide a coarse setting of the potentiometer's wiper position. The resistances of the variable resistance networks are changed to provide the fine resolution for the potentiometer's wiper position. The present invention provides a large number of discrete wiper positions with a constant end-to-end resistance, while using a small number of resistors and transistors relative to prior art implementations.

40 Claims, 4 Drawing Sheets

U.S. PATENT DOCUMENTS

| | | | |
|---|---|---|---|
| 3,765,020 | | 10/1973 | Seager et al. .................. 343/5 SM |
| 3,812,478 | | 5/1974 | Tomisawa et al. .............. 340/173 R |
| 3,964,087 | | 6/1976 | Mallon ................................ 338/306 |
| 4,157,494 | | 6/1979 | Kornienko et al. ................ 323/354 |
| 4,227,663 | | 10/1980 | Ramsey et al. .................... 244/149 |
| 4,238,724 | * | 12/1980 | Klaus et al. ....................... 323/354 |
| 4,247,913 | | 1/1981 | Hiniker et al. .................... 365/228 |
| 4,271,486 | | 6/1981 | Dagostino et al. .................. 365/45 |
| 4,319,184 | | 3/1982 | Kowalczyk ........................ 323/354 |
| 4,438,415 | | 3/1984 | Hopfer .............................. 333/81 A |
| 4,439,739 | | 3/1984 | Kilian et al. ....................... 330/107 |
| 4,458,307 | | 7/1984 | McAnlis et al. ..................... 714/22 |
| 4,468,607 | | 8/1984 | Tanaka et al. ..................... 323/354 |
| 4,668,932 | | 5/1987 | Drori et al. .......................... 338/48 |
| 4,673,866 | | 6/1987 | Masuda .............................. 323/313 |
| 5,084,667 | | 1/1992 | Drori et al. ........................ 323/298 |
| 5,389,872 | * | 2/1995 | Erhart et al. ...................... 323/354 |
| 5,814,981 | * | 9/1998 | Tsuchi et al. ...................... 323/369 |
| 5,923,159 | * | 7/1999 | Ezell ................................... 323/354 |

OTHER PUBLICATIONS

Post, H. et al., "A 14–Bit Monotonic NMOS D/A Converter," *Eighth European Solid–State Circuits Conference (Digest of of Technical Papers),* Sep. 1982, pp. 69–72.

Klassen, K. B., et al., "Capacitive Absolute Voltage Division–Multiplication," *IEEE Transactions on Instrumentation and Measurement,* vol. IM–34, No. 2, Jun. 1985, pp. 331–334.

*Electronics,* "TI Process Boosts Linear CMOS ICS to LSI Densities," Dec. 18, 1986, pp. 71–73.

Professor Nomura, "Lecture #8 of Lectures on Electronic Circuit Theory," Apr. 30, 1963, Tokyo University, pp. 162–171, (partial translation attached.).

Mr. Akiyo Egawa, supervising Editor, Mr. Suzuki, Editor, CMOS Ooyoo Kairo Sekkei (CMOS Circuit Design Handbook), Aug. 15, 1995, pp 186–190 (partial translation attached).

* cited by examiner

HIGH-RESOLUTION, HIGH-PRECISION SOLID-STATE POTENTIOMETER

FIELD OF THE INVENTION

The present invention relates generally to the field of variable impedance elements and more specifically to solid-state variable impedance elements for use in electronic circuits.

BACKGROUND OF THE INVENTION

Electronic circuits containing variable impedance elements are well known to the art. These variable impedance elements are usually in the form of variable resistors, also called potentiometers. Circuits using variable inductors or capacitors are also well known. These variable impedance elements are usually manually adjusted to provide a selected impedance so as to affect some aspect of the circuit in which they are located. For example, a potentiometer may be set to a value which maximizes a signal generated at a node in a given circuit.

Manual adjustment of potentiometers is usually unsatisfactory in circuits under the control of data processing systems or other external electric circuits where ongoing adjustment of the potentiometer is necessary for circuit operation. The data processing system often must change the value of the variable impedance element in a time that is short relative to the time required to complete a manual adjustment of the variable impedance element. Manual adjustment also requires the presence of a human operator which is impractical in many situations in which variable impedance elements are employed. Remote control of resistance by a computer or digital system is needed in many applications.

Potentiometers which are adjusted mechanically by motors or other actuators under external control are also known to the prior art. Although these potentiometers relieve the need for an operator, they are still unsatisfactory in many applications. First, the time to make an adjustment is still too long for many applications. Second, the long term reliability of such electromechanical devices is not sufficient for many applications requiring variable impedance elements. Finally, such systems are often too large and economically unattractive for many applications.

Solid-state potentiometers have been developed as a solution to the above problems. These potentiometers generally comprise a network of resistors that are selectively connected to a wiper terminal by a network of transistors, all of which are integrated onto a single chip of semiconductor. Because fixed-values resistors are used and because the wiper position is selected by one or more transistors, the resistance value between a wiper and a main terminal of a solid-state potentiometer can only have a finite number of values. As an example, a 16-value solid-state potentiometer may comprise 15 equal-value resistors connected in series to form a series resistor stack, with the stack being connected between the two main terminals of the potentiometer. A select transistor is then coupled between each internal node of the series-resistor stack and the wiper terminal, and between each main terminal and the wiper terminal, for a total of 16 select transistors. One of the select transistors is set in a conducting state to select one point along the series-resistor stack. As can be seen by this example, the number of resistors and transistors required to implement a solid-state potentiometer increases linearly with the desired number of discrete values. In general, the chip area and cost of implementing a solid-state potentiometer increase, and the number of resistors and transistors increase, as the number of discrete values increases.

Since the development of solid-state potentiometers, there has been a desire to find a combination of resistors and transistors that provides a larger number of discrete values with less chip area.

SUMMARY OF THE INVENTION

The present invention encompasses solid-state potentiometers that can provide a large number of discrete values using a small number of components, and therefore requiring less chip area and less cost to manufacture. Broadly stated, a potentiometer according to the present invention comprises a first main terminal, a second main terminal, a wiper terminal, and a resistor stack comprising a plurality M of resistors coupled in series to one another at a plurality of M−1 internal nodes, each internal node coupling two adjacent resistors of the stack. Each of the resistors in the stack has substantially the same value of $R_S$ ohms, each of the resistors preferably being within $0.1 \cdot R_S$ of $R_S$. The potentiometer further comprises a first variable resistance network coupled at one end of the resistor stack and a second variable resistance network coupled at the other end of the resistor stack. The first variable resistance network has a first terminal coupled to the potentiometer's first main terminal, a second terminal coupled to the free terminal of the first resistor in the resistor stack, and a variable resistance value $R_1$ which varies between zero ohms and $R_P$ ohms. $R_P$ has a value of between $0.75 \cdot R_S$ and $1.25 \cdot R_S$, and preferably between $0.75 \cdot R_S$ and $R_S$.

The second variable resistance network has a first terminal coupled to the potentiometer's second main terminal, a second terminal coupled to the free terminal of the last resistor in the resistor stack, and a variable resistance value $R_2$ which is maintained substantially at value of $(R_P-R_1)$. The wiper terminal is selectively coupled to one of the internal nodes of the resistor stack, or to one of the second terminals of the variable resistor networks, to provide a coarse setting of the potentiometer. (The wiper terminal may also be selectively coupled to either of the potentiometer's main terminals in order to provide a "rail-to-rail" range for the potentiometer.) The resistances of the variable resistance networks are changed to provide the fine resolution for the potentiometer.

As indicated above, in preferred embodiments, the resistance $R_2$ of the second variable resistance network is coordinated in a complementary manner ($R_2 \cong R_P-R_1$) to the resistance $R_1$ of the first variable resistance network so that the sum of these two resistances is approximately constant ($R_1+R_2 \cong R_P$) for any wiper setting of the potentiometer. By approximately constant, we mean that the sum $R_1+R_2$ is at least within 10% of $R_P$. This results in the resistance between the main terminals of the potentiometer being kept at a substantially constant value (i.e., maintaining a constant end-to-end resistance). This is a tremendous improvement over R–2R ladder networks, which have widely varying end-to-end resistances. In addition, the value of $R_P$ is selected to be near to the value of resistance $R_S$ of each resistor in the resistor stack. In preferred linear potentiometer embodiments, each variable resistance network has a plurality N of resistance values which are spaced substantially equally from one another by an increment $\Delta R_P$ as follows: $0, \Delta R_P, 2 \cdot \Delta R_P, 3 \cdot \Delta R_P, \ldots, (N-1) \cdot \Delta R_P$. In addition, the value of $R_P$ is substantially equal to the quantity ($R_S-\Delta R_P$), preferably being within $\frac{1}{2} \cdot \Delta R_P$ of that quantity, and more preferably within $\frac{1}{4} \cdot \Delta R_P$, and most preferably within $0.1 \cdot \Delta R_P$. With N discrete resistance values in the variable resistance networks, and M resistors in the resistor stack, a linear embodiment of the potentiometer will have $(M+1) \cdot N$ discrete values.

In a preferred embodiments of the present invention, each variable resistor network comprises a parallel combination of resistors which are selectively turned on and off by respective switches (e.g., transistors) to provide a range of discrete steps between 0 ohms and $R_P$ ohms. In linear potentiometers, these steps are substantially equal.

The above combination of two coordinated variable resistance networks placed on either side of a resistor stack enables one to construct a solid-state potentiometer which provides a large number of discrete wiper positions (values) with a constant end-to-end resistance, while using a small number of resistors and transistors relative to prior art implementations. A further advantage of the invention is that the potentiometer may be constructed with a small number of selection transistors turned on within the current path between the potentiometer's main terminals, thereby providing higher accuracy.

Accordingly, it is an object of the present invention to provide a topology for a digitally controlled potentiometer which enables the construction of a solid-state potentiometer which has a larger number of discrete values while using less chip area and fewer transistors relative to prior art implementations.

It is another object of the present invention to minimize the number of selection transistors in the main current path between the main terminals of the potentiometer in order to increase the accuracy of the potentiometer.

It is yet another object of the present invention to provide a topology for a digitally controlled potentiometer which enables the construction of a solid-state potentiometer which has a larger number of discrete values while achieving a constant end-to-end resistance.

These and other objects of the present invention will become apparent to those skilled in the art from the following detailed description of the invention, the accompanying drawings, and the appended claims.

DETAILED DESCRIPTION OF THE INVENTION

Figure 1:
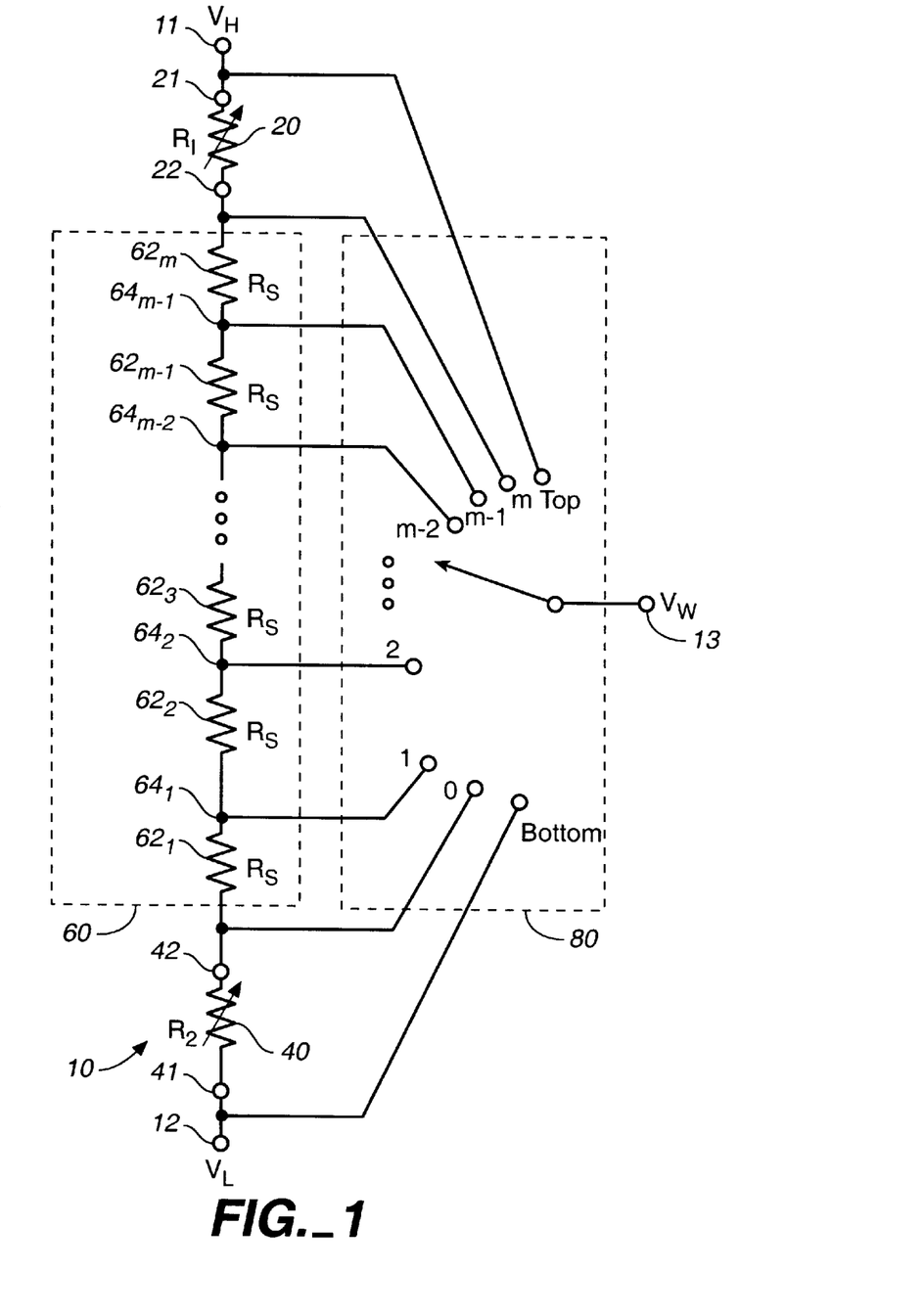
FIG. 1 is a schematic diagram of a first potentiometer embodiment according to the present invention.

FIG. 1 shows a schematic diagram of a first potentiometer embodiment 10 according to the present invention. Potentiometer 10 comprises a first main terminal 11, a second main terminal 12, and a wiper terminal 13. In general applications of potentiometer 10, a voltage is applied between main terminals 11 and 12 by applying voltages $V_H$ and $V_L$ respectively to these terminals, with an intermediate potential $V_W$ being tapped off by the wiper terminal 13.

Potentiometer 10 further comprises a first variable resistance network 20 which has a first terminal 21 coupled to main terminal 11, a second terminal 22, and a variable resistance value $R_1$ which varies between zero ohms and a value of $R_P$ ohms. Potentiometer 10 further comprises a second variable resistance network 40 which has a first terminal 41 coupled to main terminal 12, a second terminal 42, and a variable resistance value $R_2$ which varies between zero ohms and $R_P$ ohms. In addition, resistance $R_2$ is set substantially at a value of $(R_P - R_1)$, which is complementary to the value of the first variable resistance network.

In addition, potentiometer 10 comprises a resistor stack 60 having a plurality M of resistors $62_1$, $62_2$, $62_3$, ..., $62_{M-1}$, $62_M$ coupled in series to one another at a plurality of M-1 internal nodes $64_1$, $64_2$, ..., $64_{M-2}$, $64_{M-1}$, each internal node $64_k$ coupling two adjacent resistors $62_k$ and $62_{k+1}$ of the stack, as shown in the figure. The top resistor $62_M$ of stack 60 has its free terminal (the one not coupled to internal node $64_{M-1}$) coupled to second terminal 22 of first variable resistance network 20. Similarly, the bottom resistor $62_1$ of stack 60 has its free terminal (the one not coupled to internal node $64_1$) coupled to second terminal 42 of second variable resistance network 40. In preferred linear potentiometer embodiments of the present invention, each of resistors $62_k$ has a value substantially equal to a value of $R_S$ ohms, preferably being with 10% or less of $R_S$.

Potentiometer 10 also comprises a selector 80 which selects one of the internal nodes $64_k$ or the second terminals 22 and 42 of the variable resistor networks, and couples the selected node or terminal to wiper terminal 13. In preferred embodiments, selector 80 also selects from the potentiometer's main terminals 11 and 12 in order to provide a fall "rail-to-rail" range for the wiper. Selector circuit 80 provides a coarse setting of the potentiometer, while variable resistor networks 20 and 40 provide a fine resolution between each coarse setting of selector 80. For example, to change wiper 13 from a low potential $V_L$ at second main terminal 12 through all of the available potentiometer values to a high potential $V_H$ at first main terminal 11, one would execute the following steps:

1. first set selector 80 to the "Bottom" switch position;
2. then move selector 80 to the "0" switch position with $R_2$ set to zero and $R_1$ set to $R_P$;
3. then increase $R_2$ in value by discrete steps (while decreasing $R_1$ in a complementary manner) until $R_2$ reaches $R_P$;
4. then increment selector 80 to the next position with $R_2$ set to zero and $R_1$ set to $R_P$; and
5. then repeat steps 3 and 4 until selector 80 is incremented to the "Top" position.

In preferred linear potentiometer embodiments, each of variable resistance networks 20 and 40 has a plurality N of resistance values which are spaced substantially equally from one another by an increment $\Delta R_P$ as follows. 0, $\Delta R_P$, $2 \cdot \Delta R_P$, $3 \cdot \Delta R_P$, ..., $(N-1) \cdot \Delta R_P$, with $\Delta R_P = R_P/(N-1)$, with each resistance value being within $\frac{1}{2} \cdot \Delta R_P$ of its target value, and preferably within $\frac{1}{4} \cdot \Delta R_P$ of its target value, and most preferably within $0.1 \cdot \Delta R_P$ of its target value. In addition, the value of $R_P$ is substantially equal to the quantity $(R_S - \Delta R_P)$, preferably being within $\frac{1}{2} \cdot \Delta R_P$ of that quantity, and more preferably within $\frac{1}{4} \cdot \Delta R_P$ or less. With N discrete resistance values in variable resistance networks 20 and 40, and with M resistors in the resistor stack, a linear embodiment of the potentiometer will have (M+1)·N possible discrete position values for its wiper. To provide reasonable linearity of the potentiometer, each of the resistors $63_K$ in resistor stack 60 has a value that is within ½·$\Delta R_P$ of $R_S$; to provide better linearity, each resistor $63_K$ has a value that is within ¼·$\Delta R_P$ of $R_S$; in preferred embodiments, each resistor $63_K$ has a value that is within 0.1·$\Delta R_P$ of $R_S$. In addition, the sum of the resistances $R_1+R_2$ is at least within 10% of $R_P$, and preferably within ½·$\Delta R_P$ of $R_S$.

Figure 2:
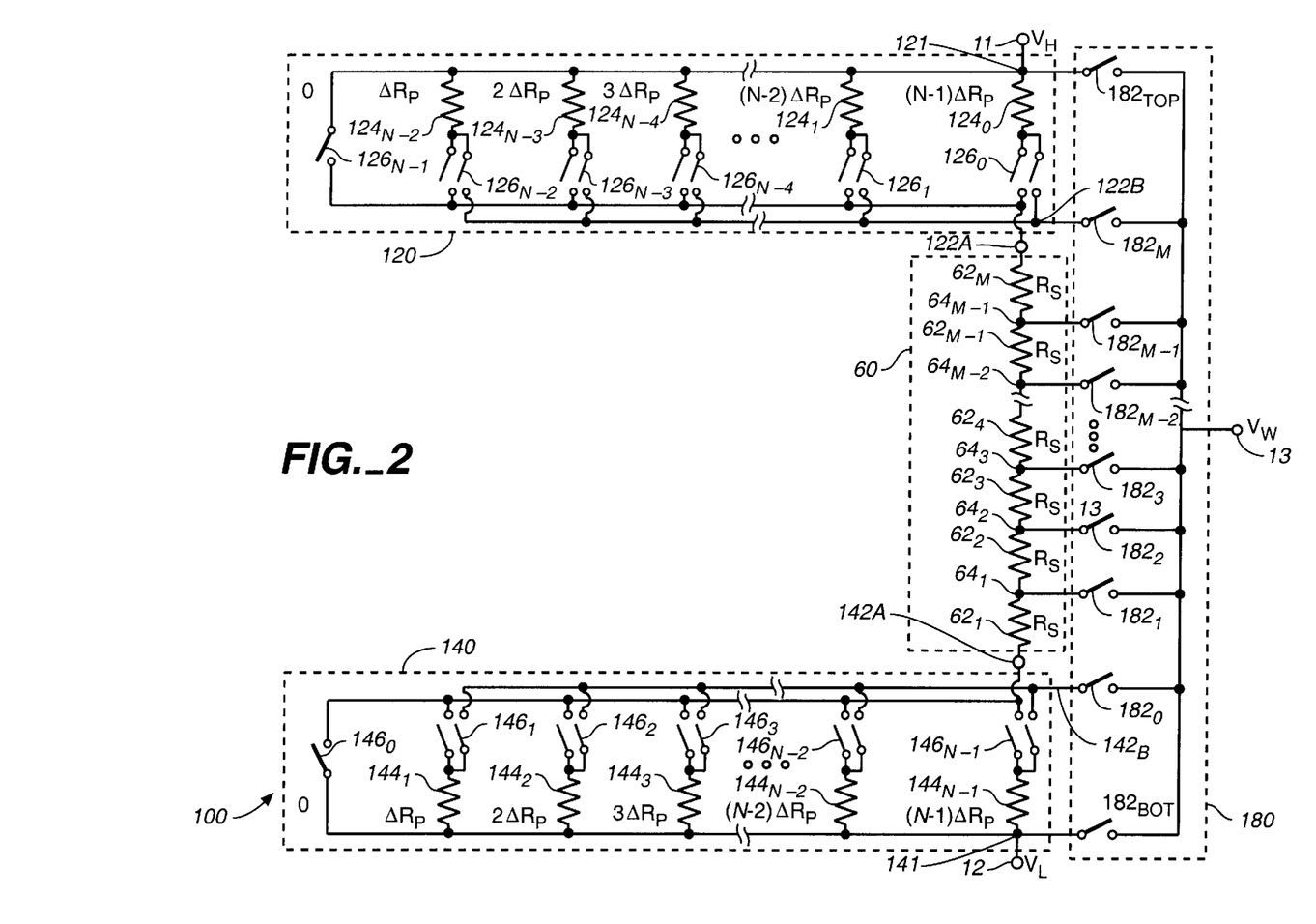
FIG. 2 is a schematic diagram of a second potentiometer embodiment according to the present invention.

FIG. 2 shows a schematic diagram of a second embodiment 100 of a potentiometer according to the present invention. Potentiometer 100 comprises first main terminal 11, second main terminal 12, wiper terminal 13, and resistor stack 60 as previously described, and comprises a first variable resistance network 120, a second variable resistance network 140, and a selector 180 in place of network 20, network 40, and selector 80, respectively, of FIG. 1. Each of networks 120 and 140 have the functions and properties of their counterparts 20 and 40, respectively, and are specific implementations thereof. Likewise, selector 180 has the functions and properties of its counterpart selector 80, and is a specific implementation thereof.

Variable Resistance Network 140

We will describe second variable resistance network 140 first. Variable resistance network 140 comprises a first terminal 141 coupled to second main terminal 12, a second terminal 142A coupled to the bottom resistor of resistor stack 60, a sense terminal 142B coupled to selector 180, and a plurality N of parallel current branches, each branch being coupled between the first terminal 141 and the second terminal 142A. The first current branch comprises a switch 146₀ coupled between terminals 141 and 142A, and provides an infinite resistance when switch 146₀ is open, and near zero resistance ($R_{ON}$ in practice, as described below) when the switch is closed. The remaining N−1 current branches comprise a plurality of resistors 144₁ through 144$_{N-1}$ and a corresponding plurality of double-pole, single-throw switches 146₁ through 146$_{N-1}$. Each one of these branches comprises one of the resistors 144$_K$ (K=1 through K=N−1) coupled in series with the first pole of one of the corresponding switches 146$_K$, with the series combination being coupled between terminals 141 and 142A, as shown in FIG. 2. Each resistor 144$_K$ (K=1 through K=N−1) is also coupled to the second pole of its corresponding switch 146$_K$, with this series combination being coupled between terminals 141 and 142B. This arrangement of two-poles per switch 146$_K$, with the first pole coupled to resistor stack 60 through second terminal 142A and the second pole coupled to selector 180 through sense terminal 142B, enables selector 180 to measure the voltage across the corresponding resistor 144$_K$ directly without having to measure the voltage drop that may be developed across switch 146$_K$. In this manner, sense terminal 142B acts as an "ideal" second terminal of network 140 for selector 180.

It is noted that switch 146₀ does not use a second pole like the other switches 146$_K$; this is because, as described below in greater detail, selector 180 does not couple to sense terminal 142B through switch 182₀ when switch 146₀ is conducting, which would normally occur when the wiper is set to the lower rail at voltage $V_L$. Instead, under this condition, selector 180 selects the rail voltage $V_L$ through switch 182$_{BOT}$, obviating the need for the sensing performed by sense terminal 142B and the second poles of the switches. Nonetheless, in other applications, or in applications where switch 182$_{BOT}$ is not used, switch 146₀ may be augmented to include a second pole coupled between first terminal 141 and sense terminal 142B.

Figure 3:
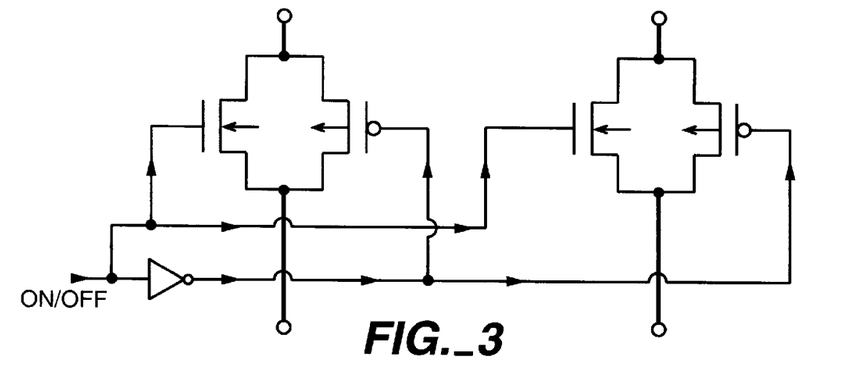
FIG. 3 shows an exemplary implementation of a switch used in the potentiometer shown in FIG. 2 according to the present invention.

Network 140 provides a plurality N of resistance values which are spaced substantially equally from one another by an increment $\Delta R_P$ as follows: 0, $\Delta R_P$, 2·$\Delta R_P$, 3·$\Delta R_P$, ..., (N−1)·$\Delta R_P$. This is accomplished by setting the value of resistors 144₁ through 144$_{N-1}$ substantially equal to the values $\Delta R_P$, 2·$\Delta R_P$, 3·$\Delta R_P$, ..., (N−1)·$\Delta R_P$, as shown in the figure, and by closing only one of switches 146 while leaving the other switches in open positions. By "substantially equally" and "substantially equal", we mean each resistance value and each resistor value is at least within ½·$\Delta R_P$ of its target value, and preferably within ¼$\Delta AR_P$ of its target value. In practice, each of switches 146₀–146$_{N-1}$ is implemented by two or more transistors. A preferred implementation of switch 146 is shown in FIG. 3, which shows two conventional analog CMOS switches, one for each pole. Each CMOS switch comprises an NMOS transistor and a PMOS transistor coupled with their conduction terminals in parallel, and being driven by complementary logic signals at their gates. Referring back to FIG. 2, each switch 146₀–146$_{N-1}$ may only comprise a single NMOS transistor for each of its poles (one NMOS transistor per pole) if the following condition will exist in the specific application for potentiometer 100: the voltage $V_L$ will always be much less than $V_{ON,N}-V_{TH,N}$, where $V_{ON,N}$ is the voltage applied to the gate of the NMOS transistor to set it in its conducting state, and where $V_{TH,N}$ is the threshold voltage of the NMOS transistor.

In practice, the transistor(s) of each switch 146 have a collective finite resistance $R_{ON}$ when they are in their conducting state(s). If $R_{ON}$ is ten percent or more of the value of $\Delta R_P$, then corrective measures may need to be taken to improve the accuracy of the potentiometer. A first corrective action, as alluded to above, is to provide a second pole with each switch 146₁–146$_{N-1}$, with the second pole coupled between sense terminal 142B (and thereby selector 180) and the corresponding resistor 144₁–144$_{N-1}$. Assuming that very little current flows from the wiper terminal 13, then the voltage drop across the second pole is virtually zero when the switch is closed. In contrast, the first pole of the switch, which is coupled to resistor stack 60, will be carrying the current between main terminals 11 and 12 when the switch is closed, and a voltage drop will be developed. A second corrective action is to determine the average value of RON for the application that is anticipated for potentiometer 100, and to then subtract this amount from the resistance values of each of resistors 144₁–144$_{N-1}$. In this case, then second poles of the switches 146₁–146$_{N-1}$ can be omitted, and selector 180 may be coupled to terminal 142A.

Variable Resistance Network 120

Similar to network 140, first variable resistance network 120 comprises a first terminal 121 coupled to first main terminal 1, a second terminal 122A coupled to the top resistor of resistor stack 60, a sense terminal 122B coupled to selector 180, and a plurality of N parallel current branches. The first N−1 current branches comprise a plurality of resistors 124₀ through 124$_{N}$−2 and a corresponding plurality of double-pole, single-throw switches 126₀ through 126$_{N-2}$. Each one of these branches comprises one of the resistors 124$_K$ (K=0 through N−2) coupled in series with the first pole of one of the corresponding switches 126K, with the series combination being coupled between terminals 121 and 122A, as shown in FIG. 2. Each resistor 124$_K$ (K=1 through N−2) is also coupled to the second pole of its corresponding switch 126$_K$, with this series combination being coupled between terminals 121 and 122B. This arrangement of two-poles per switch $126_K$, with the first pole going to resistor stack 60 and the second pole going to selector 180, enables selector 180 to measure the voltage across the corresponding resistor $124_K$ directly without having to measure the voltage drop that may be developed across switch $126_K$, as previously described above. In this manner, sense terminal 122B acts as an "ideal" second terminal of network 120 for selector 180. The last current branch comprises a switch $126_{N-1}$ coupled between terminals 121 and 122A, and provides an infinite resistance when switch $126_{N-1}$ is open, and near zero resistance ($R_{ON}$ in practice) when the switch is closed. Like switch $146_0$ of network 140, switch $126_{N-1}$ need not have a second pole for the reason that selector 180 will select the top rail voltage $V_H$ through switch $182_{TOP}$; however, in other applications a second pole may be added to switch $126_{N-1}$.

Network 120 provides a plurality N of resistance values which are spaced substantially equally from one another by an increment $\Delta R_P$ as follows: $(N-1)\cdot\Delta R_P$, $(N-2)\cdot\Delta R_P$ ..., $3\cdot\Delta R_P$, $2\cdot\Delta R_P$, $\Delta R_P$, and 0. This is accomplished by setting the value of resistors $124_0$ through $124_{N-2}$ substantially equal to the values $(N-1)\cdot\Delta R_P$, $(N-2)\cdot\Delta R_P$, ..., $3\cdot\Delta R_P$, $2\cdot\Delta R_P$, and $\Delta R_P$, as shown in the figure, and by closing only one of switches 126 while leaving the other switches in open positions. By "substantially equally" and "substantially equal", we mean each resistance value and each resistor value is at least within $\frac{1}{2}\cdot\Delta R_P$ of its target value, and preferably within $\frac{1}{4}\cdot\Delta R_P$ of its target value. These resistances are arranged in descending order, while the resistors 146 of network 140 are arranged in ascending order. In the operation of potentiometer 100, the K-th switch $126_K$, K=0 to N−1, is closed when the corresponding K-th switch $146_K$, of network 140 is closed. This results in the sum of resistors activated by switches $126_K$ and $146_K$ always being equal to $(N-1)\cdot\Delta R_P = R_P$.

In practice, each of switches $126_0$–$126_{N-1}$ is implemented by two or more transistors. A preferred implementation of transistor 126 is shown in FIG. 3, as previously described. Each switch $126_0$–$126_{N-1}$ may only comprise a single PMOS transistor for each of its poles (one PMOS transistor per pole) if the following condition will exist in the specific application for potentiometer 100: the voltage $V_H$ will always be much greater than $V_{ON,P} + V_{TH,P}$, where $V_{ON,P}$ is the voltage applied to the gate of the PMOS transistor to set it in its conducting state, and where $V_{TH,P}$ is the threshold voltage of the PMOS transistor. The same corrective actions described above for accounting for the conducting resistance $R_{ON}$ of the switches 146 maybe taken for switches 126.

Selector 180

Selector 180 is relatively simple. It comprises a first switch $182_{BOT}$ coupled between second main terminal 12 and wiper terminal 13, a second switch $182_0$ coupled between the sense terminal 142B of second variable resistance network 140 and wiper terminal 13, a third switch $182_M$ coupled between the sense terminal 122B of first variable resistance network 120 and wiper terminal 13, and a fourth switch $182_{TOP}$ coupled between first main terminal 11 and wiper terminal 13. Selector 180 further comprises a plurality of M−1 additional switches $182_1$ through $182_{M-1}$, each of which is coupled between a corresponding internal node $64_k$ of resistor stack 60 and wiper terminal 13, as shown in FIG. 2. Each of switches $182_{BOT}$, $182_{TOP}$, and $182_0$–$182_M$ preferably comprises a single CMOS transistor switch, as shown in FIG. 3.

Switch Selector Circuit

Figure 4:
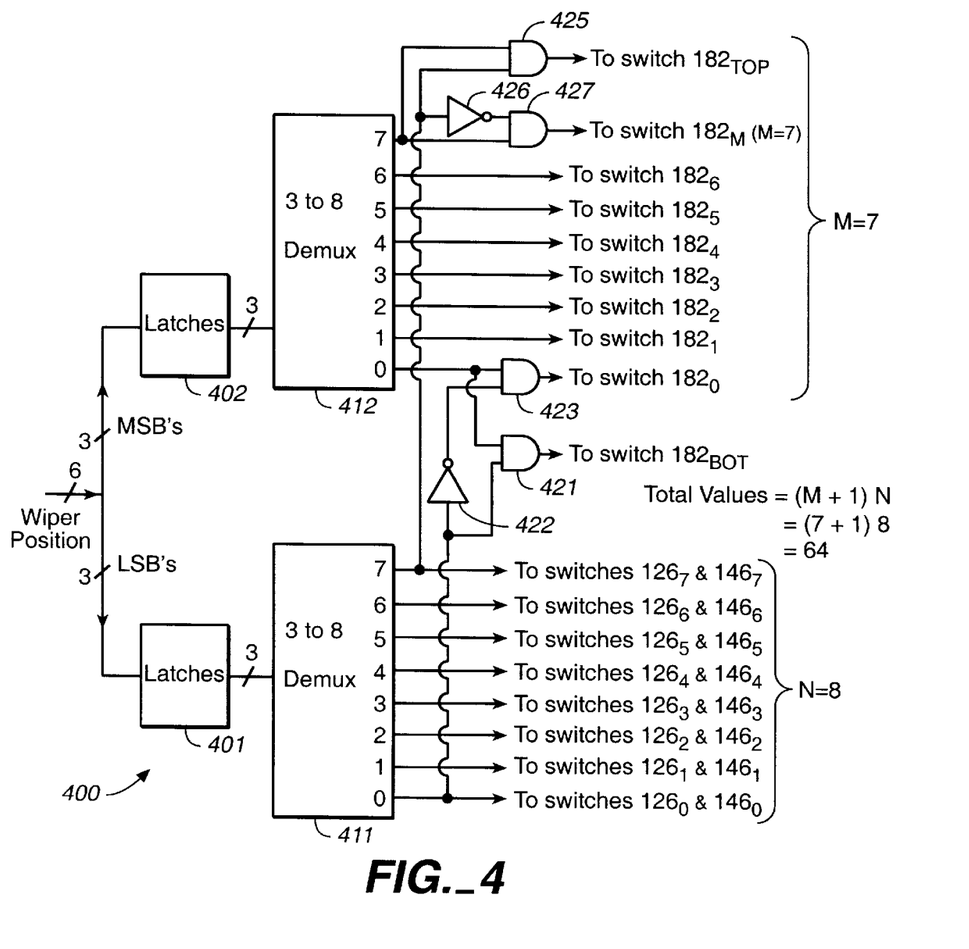
FIG. 4 shows an exemplary control circuit for activating selection transistors for the embodiment of FIG. 2 according to the present invention.

In general, it will be convenient for a user to specify the wiper position of the potentiometer with a single y-bit digital number. A circuit may then be used to receive this number, and generate signals to transistors 126, 146, and 182 which implement the specified wiper position. FIG. 4 provides an exemplary circuit 400 for the case where a 6-bit digital number is supplied (y=6). The three least significant bits will be used to select from 8 different values in each of the variable resistance networks 120 and 140, and the three most significant bits will be used to select from the six internal nodes that are between 7 resistors of resistor stack 60 and the two second terminals of networks 120 and 140. The bits of the number are received and latched in by latches 401 and 402, which latch the 3 least-significant bits and 3 most-significant bits, respectively. The outputs of latches 401 and 402 are directed to respective 3-to-8 de-multiplexers 411 and 412, respectively. The outputs of de-multiplexer 411 generates the control signals to transistors 126 and 146 of variable networks 120 and 140, as shown in the figure.

Switch $182_{BOT}$ is to be set in a conducting state when the input digital word is equal to zero. A signal for this switch may be readily generated by logically ANDing together the "0"-line outputs of de-multiplexers 411 and 412, as is done by AND gate 421. When the input digital words has values of 1 (000001) through 7 (000111), switch $182_0$ is to be set in a conducting state. A signal for this can be generated by ANDing together the complement of the "0"-line output of de-multiplexer 411 with the "0"-line output of de-multiplexer and 412, as is done by inverter 422 and AND gate 423. The control signals for switches $182_1$ through $182_6$ are provided by the "1"-line output through the "6"-line output, respectively, of de-multiplexer 412. Switch $182_{TOP}$ is to be set in a conducting state when the input digital number has a value of $2^6-1$ (111111). A signal for this switch may be readily generated by logically ANDing together the "7"-line outputs of de-multiplexers 411 and 412, as is done by AND gate 425. Finally, when the input digital words has values of $2^6-8$ (111000) through $2^6-2$ (111110), switch $182_M$ is to be set in a conducting state. A signal for this can generated by ANDing together the complement of the "7"-line output of de-multiplexer 411 with the "7"-line output of de-multiplexer and 412, as is done by inverter 426 and AND gate 427.

The circuitry described above only allows one of transistors 182 to be on at a time.

Additional Embodiments of the Variable Resistance Networks

Figure 5:
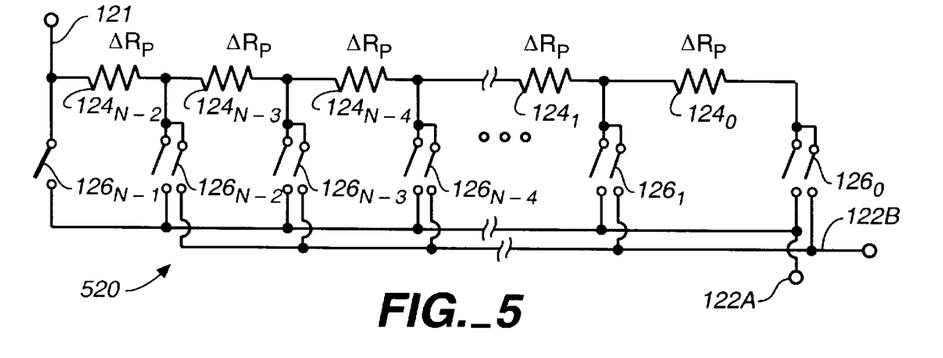
FIG. 5 shows another implementation of the first variable resistor network according to the present invention.

It may be appreciated that each of variable resistance networks 20 and 40 may be implemented with a line of series-connected resistors rather than parallel configured resistors. As an example, FIG. 5 shows a variable network 520 comprising a line of N−1 series-connected resistors $124_0$ through $124_{N-2}$, each with a value substantially equal to $\Delta R_P$, and N double-pole selection switches $126_0$ through $126_{N-1}$. The first and last resistors each having a free terminal which is not connected to an intermediate node, each free terminal being an end of the resistor line. One end of the line of series-connected resistors is coupled to first terminal 121. The first pole of each switch 126 is coupled to second terminal 122A, and the second pole of each switch 126 (except for switch $126_{N-1}$) is coupled to sense terminal 122B. Each resistor $124_K$ has a value that is within $\frac{1}{2}\cdot\Delta R_P$ of $\Delta R_P$, and preferably within $\frac{1}{4}\cdot\Delta R_P$ of $\Delta R_P$, and more preferably $0.1\cdot\Delta R_P$ of $\Delta R_P$.

Figure 6:
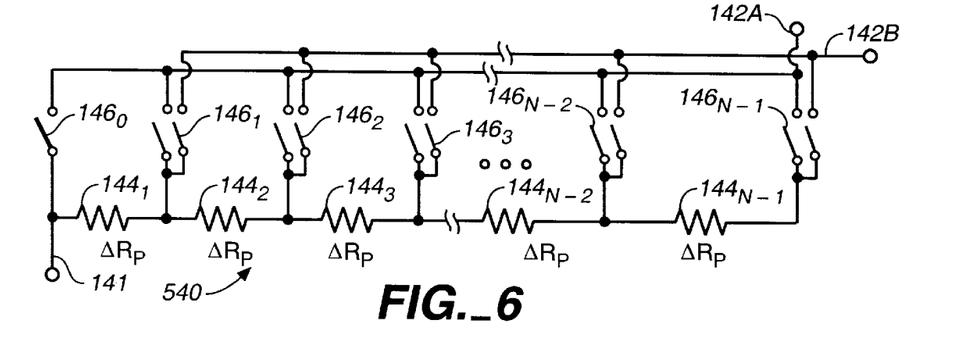
FIG. 6 shows another implementation of the second variable resistor network according to the present invention.

FIG. 6 shows the corresponding embodiment 540 for second resistor network 140. It is a mirror image of embodiment 520 taken along a horizontal line above embodiment 540.

It may be appreciated that, instead of using sense terminals 122B and 142B, networks 520 and 540 may be compensated for the average on-resistance $R_{ON}$ of the switches. For the topology of network 520, the average value of $R_{ON}$ is subtracted from the resistance values of only resistor $124_{N-2}$. For the topology of network 540, the average value of $R_{ON}$ is subtracted from the resistance values of only resistor $144_1$.

Figure 7:
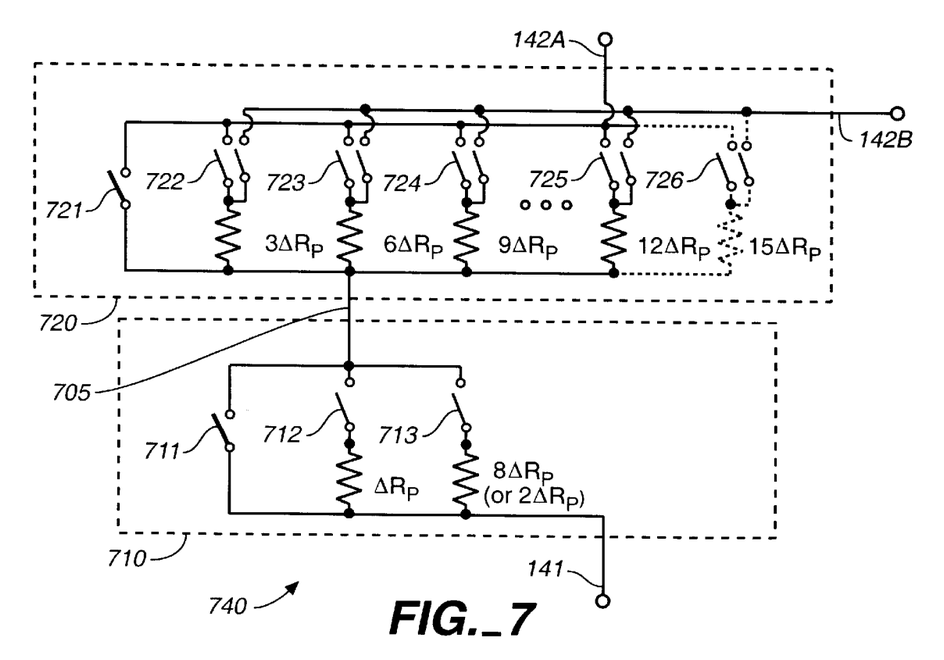
FIG. 7 shows another implementation of the second variable resistor network according to the present invention.

Another embodiment of the second variable resistor network is shown at 740 in FIG. 7, which provides 12 resistance values, and optionally 16 resistance values. Network 740 comprises a first parallel network 710 coupled in series with a second parallel network 720 at an intermediate node 705, with the series combination coupled between first and second terminals 141 and 142A. First parallel network 710 comprises three current branches that are coupled between node 705 and first terminal 141: the first branch comprises a switch 711, the second branch comprises a switch 712 coupled in series with a resistor having a value of $\Delta R_P$, and the third branch comprises a switch 713 coupled in series with a resistor having a value of $8 \cdot \Delta R_P$. Second parallel network 720 comprises five current branches (and optionally a sixth one as shown in dashed lines), each branch being coupled between intermediate node 705 and the second terminal 142A. The first current branch comprises a switch 721 coupled between intermediate node 705 and terminal 141, and provides an infinite resistance when switch 721 is open, and near zero resistance when the switch is closed. The remaining four (or five) current branches comprise a plurality of double-pole, single-throw switches 722–725 (and optionally switch 726), each having its first pole coupled in series with a respective resistor, with the series combination being coupled between intermediate node 705 and terminal 142A. Switch 722 is coupled in series with a resistor having a value of $3 \cdot \Delta R_P$, switch 723 is coupled in series with a resistor having a value of $6 \cdot \Delta R_P$, switch 724 is coupled in series with a resistor having a value of $9 \cdot \Delta R_P$, switch 725 is coupled in series with a resistor having a value of $12 \cdot \Delta R_P$, and optional switch 726 is coupled in series with a resistor having a value of $15 \cdot \Delta R_P$. Each of these resistors is also coupled to the second pole of its corresponding switch 722–725 (and optionally 726), with this series combination being coupled between intermediate node 705 and terminal 142B for the sensing operation, as previously described above. Twelve different values of resistance are provided by network 740 by closing the following switches, and indicated in TABLE I:

TABLE I

| | |
|---|---|
| 0 | Switches 721 and 711 |
| $\Delta RRp$ | Switches 721 and 712 |
| $2 \cdot \Delta R_p$ | Switches 722, 723, and 711 |
| $3 \cdot \Delta R_p$ | Switches 722 and 711 |
| $4 \cdot \Delta R_p$ | Switches 723, 725, and 711 |
| $5 \cdot \Delta R_p$ | Switches 723, 725, and 712 |
| $6 \cdot \Delta R_p$ | Switches 723 and 711 |
| $7 \cdot \Delta R_p$ | Switches 723 and 712 |
| $8 \cdot \Delta R_p$ | Switches 721 and 713 |
| $9 \cdot \Delta R_p$ | Switches 724 and 711 |
| $10 \cdot \Delta R_p$ | Switches 724 and 712 |
| $11 \cdot \Delta R_p$ | Switches 722 and 713 |

By including a sixth branch formed by switch 726 and a resistor having a value of $15 \cdot \Delta R_P$, four more steps may be added for a total of 16, as indicated in Table II:

TABLE II

| | |
|---|---|
| $12 \cdot \Delta R_p$ | Switches 725 and 711 |
| $13 \cdot \Delta R_p$ | Switches 725 and 712 |
| $14 \cdot \Delta R_p$ | Switches 723 and 713 |
| $15 \cdot \Delta R_p$ | Switches 726 and 711 |

The same set of values may be obtained by changing the value of the resistor connected in series with switch 713 of the first parallel network to $2 \cdot \Delta R_P$, and using the following selection of switches:

TABLE III

| | |
|---|---|
| 0 | Switches 721 and 711 |
| $\Delta R_p$ | Switches 721 and 712 |
| $2 \cdot \Delta R_p$ | Switches 721 and 713 |
| $3 \cdot \Delta R_p$ | Switches 722 and 711 |
| $4 \cdot \Delta R_p$ | Switches 722 and 712 |
| $5 \cdot \Delta R_p$ | Switches 722 and 713 |
| $6 \cdot \Delta R_p$ | Switches 723 and 711 |
| $7 \cdot \Delta R_p$ | Switches 723 and 712 |
| $8 \cdot \Delta R_p$ | Switches 723 and 713 |
| $9 \cdot \Delta R_p$ | Switches 724 and 711 |
| $10 \cdot \Delta R_p$ | Switches 724 and 712 |
| $11 \cdot \Delta R_p$ | Switches 724 and 713 |
| $12 \cdot \Delta R_p$ | Switches 725 and 711 |
| $13 \cdot \Delta R_p$ | Switches 725 and 712 |
| $14 \cdot \Delta R_p$ | Switches 725 and 713 |
| $15 \cdot \Delta R_p$ | Switches 726 and 711 |

It may be appreciated that second network 720 may comprise a series resistor network as shown in FIG. 5. It may be further appreciated that first network 710 may comprise a series network as shown in FIG. 5 as well, regardless of whether second network 720 comprises a parallel resistor network or a series resistor network. (Thus, there are four possible combinations for networks 710 and 720: parallel-parallel, series-parallel, parallel-series, and series-series).

A corresponding embodiment for the first variable resistance network 20 comprises the mirror image of embodiment 740 taken along a horizontal line above embodiment 740.

While the present invention has been particularly described with respect to the illustrated embodiments, it will be appreciated that various alterations, modifications and adaptations may be made based on the present disclosure, and are intended to be within the scope of the present invention. It should be understood that, for the purposes of interpreting the claims, that the first and second resistance networks are interchangeable. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A potentiometer network comprising:

a first main terminal and a second main terminal;

a first variable resistance network comprising a first terminal, a second terminal, and a first variable resistance value ($R_1$) which varies between zero ohms and a first resistance level ($R_P$), the first terminal of the first variable resistance network being coupled to the first main terminal;

a second variable resistance network comprising a first terminal, a second terminal, and a second variable resistance value ($R_2$) which is substantially equal to the difference between the first resistance level and the first variable resistance value, the first terminal of the second variable resistance network being coupled to the second main terminal;

a resistor stack comprising a first plurality of resistors coupled in series to one another at a second plurality of internal nodes, each internal node coupling two adjacent resistors of the stack, the first resistor in the stack having a terminal coupled to the second terminal of the first variable resistance network, the last resistor in the stack having a terminal coupled to the second terminal of the second variable resistance network, each resistor having a value substantially equal to a second resistance level ($R_S$); and a wiper terminal coupled to one of the plurality of internal nodes of the resistor stack, or to one of the second terminals of the variable resistor networks, or to one of the first and second main terminals; and wherein said first resistance level ($R_P$) has a value which is in a range spanning from seventy-five percent of said second resistance level ($R_S$) to one-hundred-and-twenty-five percent of said second resistance level ($R_S$).

2. The potentiometer network of claim 1 wherein said first resistance level ($R_P$) has a value which is in a range spanning from seventy-five percent of said second resistance level ($R_S$) and one-hundred percent of said second resistance level ($R_S$).

3. The potentiometer network of claim 1 further comprising a wiper selection circuit, said circuit having a first selection switch coupled between the wiper terminal and the second terminal of the first variable resistance network, a second selection switch coupled between the wiper terminal and the second terminal of the second variable resistance network, and a plurality of additional selection switches equal in number to said second plurality of internal nodes, each additional selection switch being coupled between the wiper terminal and a respective internal node of the resistor stack, not more than one selection switch being conductive at a time.

4. The potentiometer network of claim 3 wherein said wiper selection circuit further comprises an additional selection switch coupled between said wiper terminal and said first main terminal, and another additional selection switch coupled between said wiper terminal and said second main terminal.

5. The potentiometer network of claim 4 wherein each selection switch comprises a transistor.

6. The potentiometer network of claim 4 wherein each selection switch comprises an NMOS transistor having a gate, a drain and a source, and a PMOS transistor having a gate, a drain, and a source, wherein the drain of the PMOS transistor is coupled to the drain of the NMOS transistor with the drains thereby providing a first conduction terminal of the selection switch, wherein the source of the PMOS transistor is coupled to the source of the NMOS transistor with the sources providing a second conduction terminal of the selection switch, and wherein the NMOS and PMOS transistors are driven by complementary logic signals at their gates.

7. The potentiometer network of claim 1 wherein said first variable resistance network comprises a third plurality of discrete resistance values for said first variable resistance value, each said discrete resistance value may be represented by a first index (n) which ranges from one to said third plurality, each discrete resistance value having a corresponding index value of said first index;

wherein each said discrete resistance value has a respective target value associated with it, said respective target value being equal to a first increment value ($\Delta R_P$) multiplied by a quantity which is equal to the index value for the corresponding discrete resistance value minus one, said first increment value being equal to the first resistance level ($R_P$) divided by a quantity which is equal to said third plurality minus one;

wherein each discrete resistance value is within one-half of said first increment value of its corresponding target value.

8. The potentiometer network of claim 7 wherein a set of one or more of said discrete resistance values have corresponding index values of two or more, wherein each discrete resistance value of said set is within one-tenth of said first increment value ($\Delta R_P$) of its corresponding target value.

9. The potentiometer network of claim 7 wherein said first resistance level ($R_P$) is within one-half of said first increment value of a quantity which is equal to said second resistance level ($R_S$) minus said first increment value ($\Delta R_P$).

10. The potentiometer network of claim 7 wherein said first resistance level ($R_P$) is within one-fourth of said first increment value of a quantity which is equal to said second resistance level ($R_S$) minus said first increment value ($\Delta R_P$).

11. The potentiometer network of claim 7 wherein each resistor of said resistor stack has a value that is within one-half of said first increment value of said second resistance level.

12. The potentiometer network of claim 1 wherein each resistor of said resistor stack has a value that is in a range spanning from ninety percent of said second resistance level to one-hundred-and-ten percent of said second resistance level.

13. The potentiometer network of claim 7 wherein said first variable resistance network further comprises:

a fourth plurality of selectable parallel current branches equal in number to said third plurality of discrete resistance values, the fourth plurality of current branches having a first current branch and one or more remaining current branches, each branch being coupled between the first and second terminals of said first variable resistance network, the first current branch comprising a switch, each remaining current branch comprising a switch coupled in series with a resistor.

14. The potentiometer network of claim 13 wherein each selectable current branch corresponds to a respective discrete resistance value of the first variable resistance network and corresponds to the target value associated with said respective discrete resistance value, wherein the resistor of each said remaining current branch has a resistance value which is within one-half of the first increment value of the target value which corresponds to said remaining current branch.

15. The potentiometer network of claim 13 wherein each selectable current branch corresponds to a respective discrete resistance value of the first variable resistance network and corresponds to the target value associated with said respective discrete resistance value, wherein the switches in the remaining current branches collectively have an average conduction resistance ($R_{ON}$) when in their conduction states, and wherein each resistor of each remaining current branch has a resistance value which is within one-half of the first increment value of a quantity which is equal to the target value which corresponds to said resistor's remaining current branch minus said average conduction resistance.

16. The potentiometer network of claim 13 wherein the switch of each current branch comprises an NMOS transistor having a gate, a drain and a source, and a PMOS transistor having a gate, a drain, and a source, wherein the drain of the PMOS transistor is coupled to the drain of the NMOS transistor with the drains thereby providing a first conduction terminal of the switch, wherein the source of the PMOS transistor is coupled to the source of the NMOS transistor with the sources providing a second conduction terminal of the switch, and wherein the NMOS and PMOS transistors are driven by complementary logic signals at their gates.

17. The potentiometer network of claim 13 wherein the switch of each current branch comprises one of an NMOS transistor or a PMOS transistor.

18. The potentiometer network of claim 7 wherein said first variable resistance network further comprises:
- a sense terminal; and
- a fourth plurality of selectable parallel current branches equal in number to said third plurality of discrete resistance values, the fourth plurality of current branches having a first current branch and one or more remaining current branches, each current branch being coupled between the first and second terminals of said variable resistance network, the first current branch comprising a switch, each remaining current branch comprising a resistor and a double-pole single-throw switch having a first pole and a second pole, each remaining current branch having its resistor coupled in series with the first pole of its switch to form a series combination that is coupled between the first and second terminals of the first variable resistance network, each remaining branch further having its resistor coupled in series with the second pole of its switch to form a series combination that is coupled between the first terminal and the sense terminal of the first variable resistance network; and
- wherein said wiper terminal is selectively coupled to the sense terminal.

19. The potentiometer network of claim 18 wherein each selectable current branch corresponds to a respective discrete resistance value of the first variable resistance network and corresponds to the target value associated with said respective discrete resistance value, and wherein the resistor of each said remaining current branch has a resistance value which is within one-half of the first increment value of the target value which corresponds to said remaining current branch.

20. The potentiometer network of claim 18 wherein the switch of each current branch comprises an NMOS transistor having a gate, a drain and a source, and a PMOS transistor having a gate, a drain, and a source, wherein the drain of the PMOS transistor is coupled to the drain of the NMOS transistor with the drains thereby providing a first conduction terminal of the switch, wherein the source of the PMOS transistor is coupled to the source of the NMOS transistor with the sources providing a second conduction terminal of the switch, and wherein the NMOS and PMOS transistors are driven by complementary logic signals at their gates.

21. The potentiometer network of claim 18 wherein the switch of each current branch comprises one of an NMOS transistor or a PMOS transistor.

22. The potentiometer network of claim 7 wherein said first variable resistance network further comprises:
- a fourth plurality of resistors equal in number to said third plurality of discrete resistance values minus one, said resistors being coupled in series at a set of intermediate nodes to form a line of series-connected resistors, one of said fourth plurality of resistors being a first resistor in the line and another one of said fourth plurality of resistors being a last resistor in the line, the first and last resistors each having a free terminal which is not connected to an intermediate node, the free terminal of the first resistor in the line being coupled to the first terminal of said first variable resistance network; and
- a fifth plurality of switches equal in number to said third plurality of discrete resistance values, a first one of the switches being coupled between the first and second terminals of the first variable resistance network, a second one of the switches being coupled between the free terminal of the last resistor in the line and the second terminal of the first variable resistance network, and each of the other switches being coupled between a respective intermediate node and the second terminal of the first variable resistance network.

23. The potentiometer network of claim 22 wherein each of said resistors has a value which is in a range spanning from fifty percent of the first increment value to one-hundred and fifty percent of the first increment value.

24. The potentiometer network of claim 2 wherein the switches have an average conduction resistance $R_{ON}$ when in their conduction states, and wherein the first resistor has a value that is within one-half of the first increment value of a quantity which is equal to first increment value minus said average conductance resistance.

25. The potentiometer network of claim 22 wherein the switch of each current branch comprises an NMOS transistor having a gate, a drain and a source, and a PMOS transistor having a gate, a drain, and a source, wherein the drain of the PMOS transistor is coupled to the drain of the NMOS transistor with the drains thereby providing a first conduction terminal of the switch, wherein the source of the PMOS transistor is coupled to the source of the NMOS transistor with the sources providing a second conduction terminal of the switch, and wherein the NMOS and PMOS transistors are driven by complementary logic signals at their gates.

26. The potentiometer network of claim 22 wherein the switch of each current branch comprises one of an NMOS transistor or a PMOS transistor.

27. The potentiometer network of claim 7 wherein said first variable resistance network further comprises:
- a sense terminal;
- a fourth plurality of resistors equal in number to said third plurality of discrete resistance values minus one, said resistors being coupled in series at a set of intermediate nodes to form a line of series-connected resistors, one of said fourth plurality of resistors being a first resistor in the line and another one of said fourth plurality of resistors being a last resistor in the line, the first and last resistors each having a free terminal which is not connected to an intermediate node, the free terminal of the first resistor in the line being coupled to the first terminal of said variable resistance network;
- a first switch coupled between the first and second terminals of the first variable resistance network; and
- a fifth plurality of double-pole single-throw switches equal in number to said fourth plurality of resistors, a first one of the double-pole single-throw switches having its first pole coupled between the free terminal of the last resistor in the line and the second terminal of the first variable resistance network and having its second pole coupled between the free terminal of the last resistor in the line and the sense terminal, each other double-pole single-throw switch having its first pole coupled between a respective intermediate node and the second terminal of the first variable resistance network and having its second pole coupled between the same respective intermediate node and the sense terminal.

28. The potentiometer network of claim 27 wherein each of said resistors has a value which is in a range spanning from fifty percent of the first increment value to one-hundred and fifty percent of the first increment value.

29. The potentiometer network of claim 27 wherein the switch of each current branch comprises an NMOS transistor having a gate, a drain and a source, and a PMOS transistor having a gate, a drain, and a source, wherein the drain of the PMOS transistor is coupled to the drain of the NMOS transistor with the drains thereby providing a first conduction terminal of the switch, wherein the source of the PMOS transistor is coupled to the source of the NMOS transistor with the sources providing a second conduction terminal of the switch, and wherein the NMOS and PMOS transistors are driven by complementary logic signals at their gates.

30. The potentiometer network of claim 27 wherein the switch of each current branch comprises one of an NMOS transistor or a PMOS transistor.

31. The potentiometer network of claim 7 wherein said first variable resistance network further comprises:
a first resistor network having a first terminal coupled to the first terminal of said first variable resistance network, a second terminal coupled to an intermediate node, and two or more switches and one or more resistors configured to provide a selectable resistance between the first and second terminals of the first resistor network; and
a second resistor network having a first terminal coupled to the intermediate node, a second terminal coupled to the second terminal of said first variable resistance network, and two or more switches and one or more resistors configured to provide a selectable resistance between the first and second terminals of the second resistor network.

32. The potentiometer network of claim 31 wherein said first variable resistance network further comprises a sense terminal; and wherein said second resistor network comprises a fourth plurality of selectable parallel current branches, the fourth plurality of current branches having a first current branch and one or more remaining current branches, each current branch being coupled between the first and second terminals of the second resistor network, the first current branch comprising a switch, each remaining current branch comprising a resistor and a double-pole single-throw switch having a first pole and a second pole, each remaining current branch having its resistor coupled in series with the first pole of its switch to form a series combination that is coupled between the first and second terminals of the second resistor network, each remaining branch having its resistor coupled in series with the second pole of its switch to form a series combination that is coupled between the first terminal of the second resistor network and sense terminal of the first variable resistance network; and
wherein said wiper terminal is selectively coupled to said sense terminal.

33. The potentiometer network of claim 32 wherein said first resistor network comprises a fifth plurality of selectable parallel current branches, the fifth plurality of current branches having a first current branch and one or more remaining current branches, each said current branch of the fifth plurality being coupled between the first and second terminals of the first resistor network, said first current branch of the fifth plurality comprising a switch, each remaining current branch of the fifth plurality comprising a resistor coupled in series with a switch to form a series combination that is coupled between the first and second terminals of the first resistor network.

34. The potentiometer network of claim 1 wherein said second variable resistance network comprises a third plurality of discrete resistance values for said second variable resistance value;
wherein each said discrete resistance value may be represented by a first index (n) which ranges from one to said third plurality, each discrete resistance value having a corresponding index value of said first index;
wherein each said discrete resistance value has a respective target value associated with it, said respective target value being equal to a first increment value ($\Delta R_P$) multiplied by a quantity which is equal to the index value for the corresponding discrete resistance value minus one, said first increment value being equal to the first resistance level ($R_P$) divided by a quantity which is equal to said third plurality minus one;
wherein a set of one or more of said discrete resistance values have corresponding index values of two or more, and wherein each discrete resistance value of said set is within one-half of said first increment value of its corresponding target value.

35. A variable resistance network comprising:
a first terminal and a second terminal between which a variable resistance is provided;
a sense terminal; and
a first plurality of selectable parallel current branches, each branch being coupled between the first and second terminals of said variable resistance network, the first plurality of current branches having a first current branch and one or more remaining current branches, the first current branch comprising a switch, each remaining current branch comprising a resistor and a double-pole single-throw switch having a first pole and a second pole, each remaining current branch having its resistor coupled in series with the first pole of its switch to form a series combination that is coupled between the first and second terminals of the variable resistance network, each remaining branch further having its resistor coupled in series with the second pole of its switch to form a series combination that is coupled between the first terminal and sense terminal of the variable resistance network.

36. The variable resistance network of claim 35 wherein said network has a second plurality of discrete resistance values for its variable resistance equal in number to said first plurality of selectable parallel current branches, wherein each said discrete resistance value corresponds to a respective selectable parallel current branch and may be represented by a first index (n) which ranges from one to said second plurality, each discrete resistance value having a corresponding index value of said first index;
wherein each said discrete resistance value and its corresponding current branch have a respective target value associated with them, said respective target value being equal to a first increment value ($\Delta R_P$) multiplied by a quantity which is equal to the index value for its corresponding discrete resistance value minus one;
wherein the magnitude of the difference between each discrete resistance value and its corresponding target value is less than or equal to one-half of the first increment value; and
wherein the resistor of each said remaining current branch has a resistance value which is within one-half of the first increment value of the target value associated with said remaining current branch.

37. A variable resistance network comprising:
a first terminal and a second terminal between which a variable resistance is provided;
a sense terminal;
a first plurality of resistors coupled in series at a set of intermediate nodes to form a line of series-connected resistors having a first resistor in the line and a last resistor in the line, the first and last resistors each having a free terminal which is not connected to an intermediate node, the free terminal of the first resistor in the line being coupled to the first terminal of the variable resistance network;

a first switch coupled between the first and second terminals of the variable resistance network; and a second plurality of double-pole single-throw switches equal in number to said first plurality, each double-pole single-throw switch having a first pole and a second pole, one of the switches having its first pole coupled between the free terminal of the last resistor in the line and the second terminal of the variable resistance network and having its second pole coupled between the free terminal of the last resistor in the line and the sense terminal, each other double-pole switch having its first pole coupled between a respective intermediate node and the second terminal of the variable resistance network and having its second pole coupled between the same respective intermediate node and the sense terminal.

38. The variable resistance network of claim 37 wherein said network has a second plurality of discrete resistance values for its variable resistance equal in number to said first plurality, each said discrete resistance value may be represented by a first index (n) which ranges from one to said second plurality, each discrete resistance value having a corresponding index value of said first index;

wherein each said discrete resistance value has a respective target value associated with it, said respective target value being equal to a first increment value ($\Delta R_P$) multiplied by a quantity which is equal to the index value for the corresponding discrete resistance value minus one; and wherein the magnitude of the difference between each discrete resistance value and its corresponding target value is less than or equal to one-half of the first increment value.

39. A method of adjusting a potentiometer which has a first main terminal, a second main terminal, a wiper terminal, a first changeable resistance between the first main terminal and the wiper terminal, a second changeable resistance between the second main terminal and the wiper terminal, and a wiper position which selects a set of values for the changeable resistances, the potentiometer further having a first variable resistor, a second variable resistor, and a resistor stack, the resistor stack including a first end, a second end, a first plurality of resistors coupled in series to one another at a second plurality of internal nodes, each internal node coupling two adjacent resistors of the stack, there being a first resistor in the stack having a terminal at the first end of the resistor stack and a last resistor in the stack having a terminal at the second end of the resistor stack, the first variable resistor having a first. Terminal coupled to the potentiometer's first main terminal and a second terminal coupled to the first end of the resistor stack, and the second variable resistor having a first terminal coupled to the potentiometer's second main terminal and a second terminal coupled to the second end of the resistor stack, said method comprising the steps of:

(a) adjusting the wiper position in a plurality of increments substantially equal to a first magnitude by selectively coupling the wiper terminal to one of the internal nodes of the resistor stack or to one of the ends of the resistor stack; and (b) further adjusting the wiper position in a plurality of increments having magnitudes which are less than said first magnitude by varying the value of at least one of the variable resistors, each variable resistor being coupled to a respective end of the resistor stack.

40. The method of claim 39 wherein the first variable resistor has a first resistance value, wherein the second variable resistor has a second resistance value, and wherein step (b) comprises the step of adjusting the first and second variable resistors in a complementary manner such that the total of said first and second resistance values is substantially a constant.

* * * * *

UNITED STATES PATENT AND TRADEMARK OFFICE
CERTIFICATE OF CORRECTION

PATENT NO.   : 6,331,768 B1
DATED        : December 18, 2001
INVENTOR(S)  : Drori, Joseph and Lin, Allan Ming-Lun It is certified that error appears in the above-identified patent and that said Letters Patent is hereby corrected as shown below:

<u>Column 14,</u>
Line 9, delete "24. The potentiometer network of claim 2 wherein the.." should read
-- 24. The potentiometer network of claim 23 wherein the --

<u>Column 18,</u>
Line 15, delete "stack, the first variable resistor having a first. Terminal" should read -- stack, the first variable resistor having a first terminal --

Signed and Sealed this

Ninth Day of July, 2002

*Attest:*

JAMES E. ROGAN
*Attesting Officer*   *Director of the United States Patent and Trademark Office*